(12) United States Patent
Sung et al.

(10) Patent No.: US 9,419,131 B2
(45) Date of Patent: Aug. 16, 2016

(54) SEMICONDUCTOR DEVICE HAVING VERTICAL CHANNEL TRANSISTOR AND METHOD FOR FABRICATING THE SAME

(71) Applicant: SK HYNIX INC., Icheon-si, Gyeonggi-do (KR)

(72) Inventors: Min-Gyu Sung, Icheon-si (KR); Yong-Soo Kim, Icheon-si (KR); Kwan-Yong Lim, Icheon-si (KR)

(73) Assignee: SK HYNIX INC., Icheon-Si, Gyeonggi-Do (KR)

( * ) Notice: Subject to any disclaimer, the term of this patent is extended or adjusted under 35 U.S.C. 154(b) by 0 days.

(21) Appl. No.: 14/285,065

(22) Filed: May 22, 2014

(65) Prior Publication Data
US 2014/0252458 A1    Sep. 11, 2014

Related U.S. Application Data

(62) Division of application No. 12/344,119, filed on Dec. 24, 2008, now Pat. No. 8,759,906.

(30) Foreign Application Priority Data

Mar. 21, 2008  (KR) .......................... 10-2008-0026421

(51) Int. Cl.
*H01L 29/78* (2006.01)
*H01L 27/108* (2006.01)

(52) U.S. Cl.
CPC .......... *H01L 29/7827* (2013.01); *H01L 27/108* (2013.01); *H01L 27/10876* (2013.01); *H01L 27/10891* (2013.01)

(58) Field of Classification Search
CPC ............ H01L 27/108; H01L 27/10891; H01L 27/10876; H01L 29/7827
USPC ......... 257/288, 302, 304, 305, 311, 328, 329, 257/331, 346, 401
See application file for complete search history.

(56) References Cited

U.S. PATENT DOCUMENTS

| | | | |
|---|---|---|---|
| 5,258,635 A * | 11/1993 | Nitayama et al. ............. | 257/329 |
| 5,917,211 A * | 6/1999 | Murata et al. ................. | 257/296 |
| 6,882,567 B1 * | 4/2005 | Wong ................. | G11C 11/5628 365/185.03 |
| 7,119,390 B2 * | 10/2006 | Wang ................. | H01L 27/10832 257/301 |
| 2005/0136605 A1 * | 6/2005 | Murto et al. ................... | 438/303 |
| 2006/0097304 A1 * | 5/2006 | Yoon et al. ..................... | 257/307 |
| 2008/0173937 A1 * | 7/2008 | Chung et al. .................. | 257/329 |

OTHER PUBLICATIONS

Korean Office Action for Korean patent application No. 10-2008-0026421.

* cited by examiner

*Primary Examiner* — Wael Fahmy
*Assistant Examiner* — Sue Tang
(74) *Attorney, Agent, or Firm* — Hauptman Ham, LLP

(57) ABSTRACT

A semiconductor device having a substrate; a plurality of pillar structures, wherein each pillar structure includes an active pillar disposed over the substrate; a gate electrode surrounding an outer wall of the active pillar; an interlayer dielectric (ILD) layer insulating adjacent pillar structures; a gate contact penetrating the ILD layer and configured to connect to a sidewall of the gate electrode; and a word line connected to the gate contact.

16 Claims, 18 Drawing Sheets

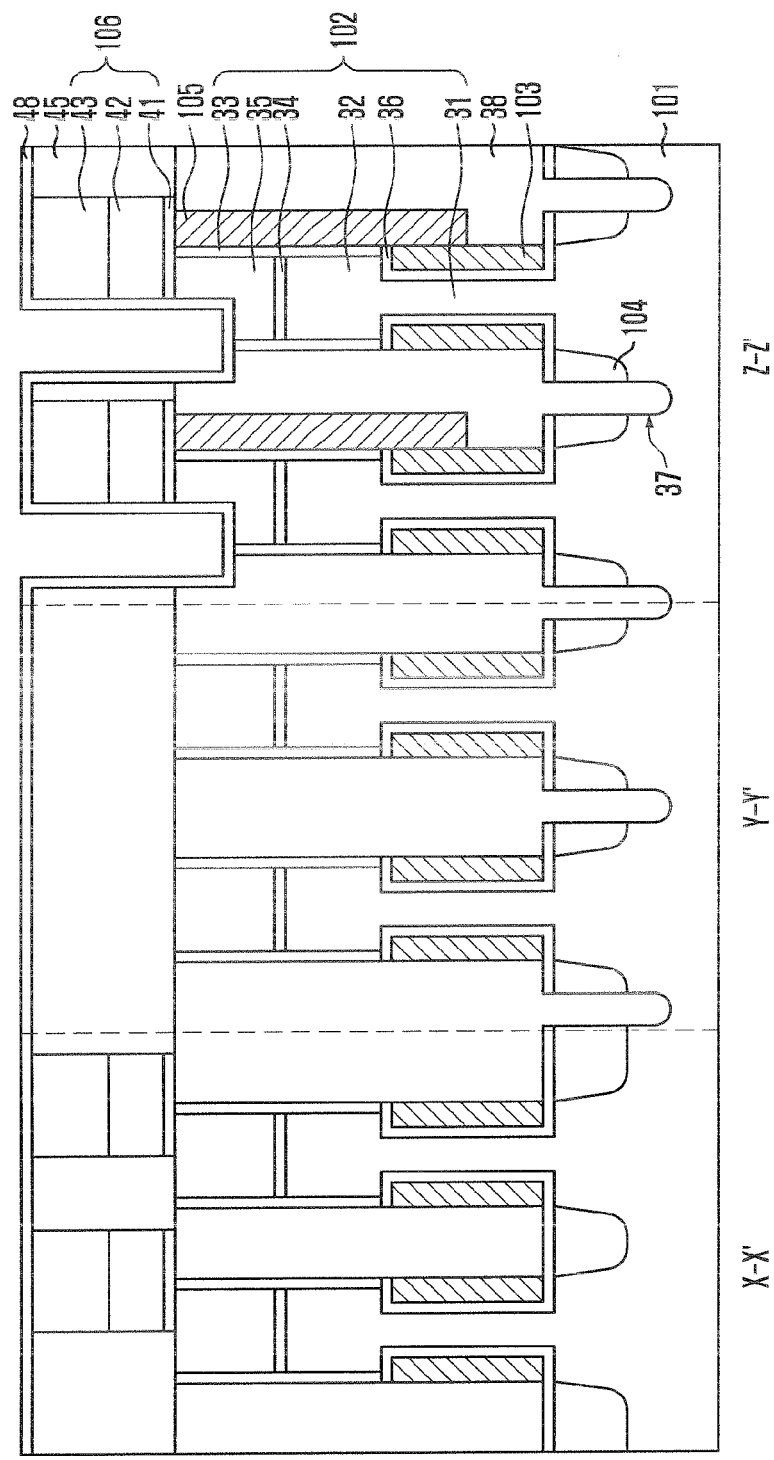

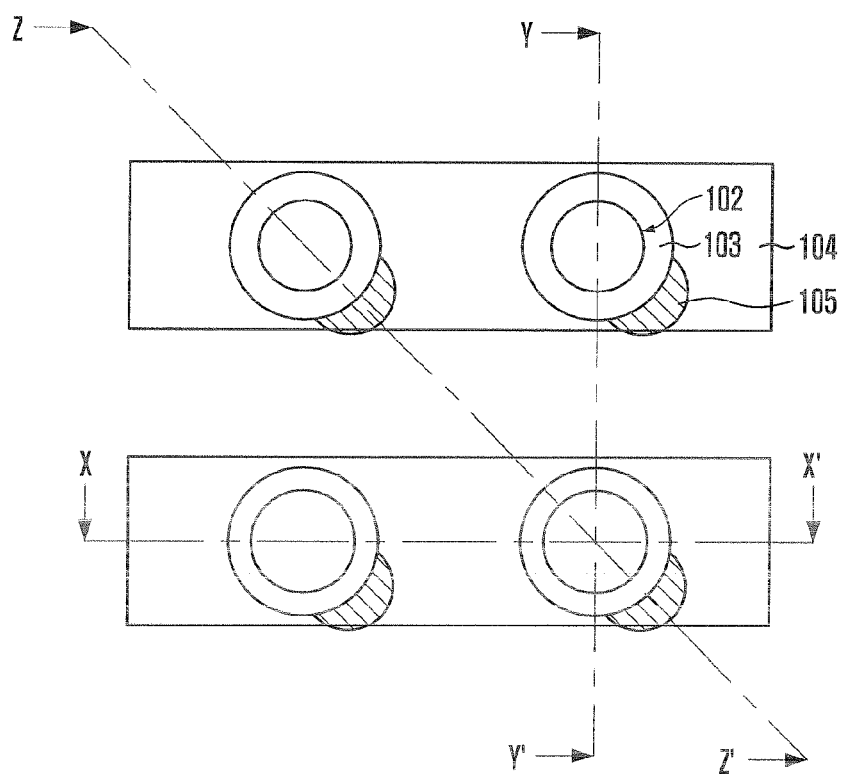

SEMICONDUCTOR DEVICE HAVING VERTICAL CHANNEL TRANSISTOR AND METHOD FOR FABRICATING THE SAME

CROSS REFERENCE TO RELATED APPLICATION

The present application is a Divisional Application of U.S. Ser. No. 12/344,119, filed on Dec. 24, 2008. It claims the priority of Korean Patent Application No. 10-2008-0026421, filed on Mar. 21, 2008 in the KIPO (Korean Intellectual Property Office), which is incorporated herein by reference in its entirety.

BACKGROUND

There are increasing demands for 40 nm memory devices with a linewidth of 40 nm and less in order to increase the degree of integration. However, it is very difficult to realize a downscaled memory device having a linewidth of 40 nm or less using a typical planar or recessed gate transistor having $8F^2$ or $6F^2$ cell architecture, (the capital letter 'F' represents a minimum feature size). Therefore, DRAM devices with $4F^2$ cell architecture are increasingly demanded because this architecture can improve the degree of integration by 1.5 to 2 times higher without scale-down.

In a vertical channel transistor, a surround type gate electrode is formed to surround an active pillar that extends vertically on a semiconductor substrate, and source and drain regions are formed in upper and lower portions of the active pillar over and under the gate electrode, respectively, so that a channel is vertically formed. Therefore, even though an area of a transistor is reduced, a channel length can be secured.

FIG. 1A illustrates a cross-sectional view of a typical semiconductor device with a vertical channel transistor, and FIG. 1B illustrates a plane view of the typical semiconductor device with the vertical channel transistor.

Referring to FIGS. 1A and 1B, a plurality of pillar structures 100 are formed on a substrate 11. Each of the pillar structures 100 includes a body pillar 12, a head pillar 13, a buffer pattern 14, a hard mask pattern 15, and a capping layer 16. The body pillar 12 and the head pillar 13 forms an active pillar.

A gate dielectric 17 and a gate electrode 18 surround an outer wall of the body pillar 12. A buried bit line 19 is formed in the substrate 11. An interlayer dielectric (ILD) layer 20 fills a trench 19A to isolate neighboring bit lines 19 from each other.

A word line 21 is connected to the gate electrode 18, and is formed in a direction crossing the bit line 19. A storage node contact 22 penetrates the hard mask pattern 15 and the buffer pattern 14, and connects to the head pillar 13.

In a typical semiconductor device, the gate electrode 18 is formed of a polysilicon, and the word line 21 is formed of a metal. Furthermore, the word line 21 is formed using a damascene process.

However, according to the typical semiconductor device, the word line 21 does not have a metal-to-metal connection, but has a metal-to-polysilicon connection because the gate electrode 18 is formed of a polysilicon. This leads to an increase in a total sheet resistance of the word line, which affects a driving current flowing through the word line 21.

For example, the word line 21 does not include only metal layers, but has a chain structure where the gate electrode 18 made of polysilicon is disposed between the metal layers. Accordingly, the sheet resistance of the word line is greatly increased due to the polysilicon layer having a high sheet resistance, which makes it difficult to realize a semiconductor device with high-speed performance.

SUMMARY

Embodiments are directed to providing a semiconductor device with a vertical channel transistor, which can realize high-speed performance by reducing a sheet resistance of a word line, and a method for fabricating the semiconductor device.

In accordance with one or more embodiments, a semiconductor device comprises: a substrate, a plurality of pillar structures each including an active pillar disposed over the substrate, a gate electrode surrounding an outer wall of the active pillar, an interlayer dielectric (ILD) layer insulating the pillar structures adjacent to each other, a gate contact penetrating the ILD layer to be connected to a sidewall of the gate electrode and a word line connected to the gate contact.

In at least some embodiments, the word line includes a material having a lower sheet resistance than the gate electrode and the gate contact, and the gate electrode and the gate contact include a polysilicon layer. Furthermore, in some embodiments, the word line includes a metal-containing layer, and the word line and the gate contact include a material having a lower sheet resistance than the gate electrode. Still further, in some embodiments the gate electrode includes a polysilicon layer, and the word line and the gate contact include a metal-containing layer.

The word line and the pillar structure may partially overlap each other, and the word line may be a zigzag-shaped wave pattern.

The word line and the active pillar are insulated from each other through a buffer layer and a hard mask layer provided over the active pillar. The semiconductor device may further include a storage node contact penetrating portions of the hard mask layer and the buffer layer to be connected to an upper region of the active pillar. The gate contact and the storage node contact may face each other, with the pillar structure interposed therebetween.

A method for fabricating a semiconductor device comprises: providing a substrate, forming a plurality of pillar structures disposed over a substrate, each of the pillar structures including an active pillar and a hard mask layer, forming a gate electrode surrounding an outer wall of the active pillar, forming an ILD layer insulating the pillar structures adjacent to each other, forming a gate contact penetrating the ILD layer to be connected to a sidewall of the gate electrode and forming a word line connected to the gate contact over the pillar structure.

The method may further include forming a storage node contact facing the gate contact to be connected to the active pillar, with the pillar structure interposed therebetween after forming the word line.

Forming the storage node contact may include forming an ILD layer insulating the word lines from each other, etching portions of the ILD layer and the hard mask layer to form a primary contact hole, forming a spacer on a sidewall of the primary contact hole, forming a secondary contact hole aligned with the spacer by performing an etching process until an upper region of the active pillar is exposed, forming a conductive layer to fill the secondary contact hole, and planarizing the conductive layer.

BRIEF DESCRIPTION OF THE DRAWINGS

FIGS. 3A to 3I illustrate a method for fabricating the semiconductor device.

FIG. 4B illustrates a plane view of a resultant structure where a gate contact is formed.

DESCRIPTION OF EMBODIMENTS

Figure 1A:
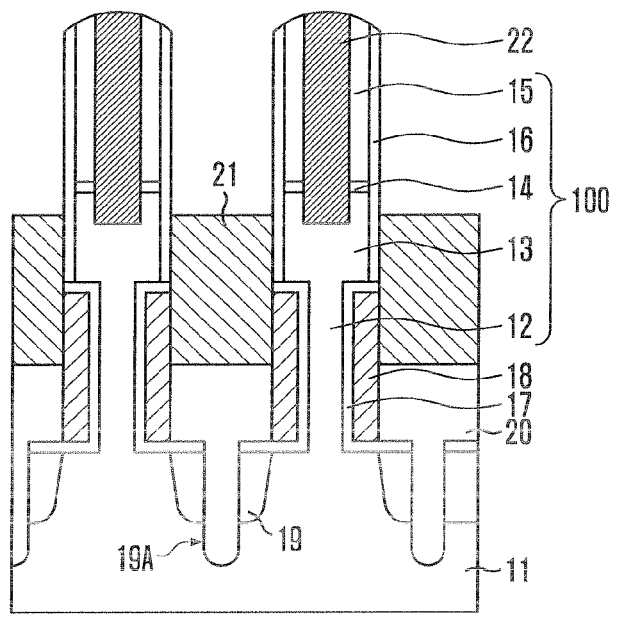
FIG. 1A illustrates a cross-sectional view of a typical semiconductor device with a vertical channel transistor.
Figure 1B:
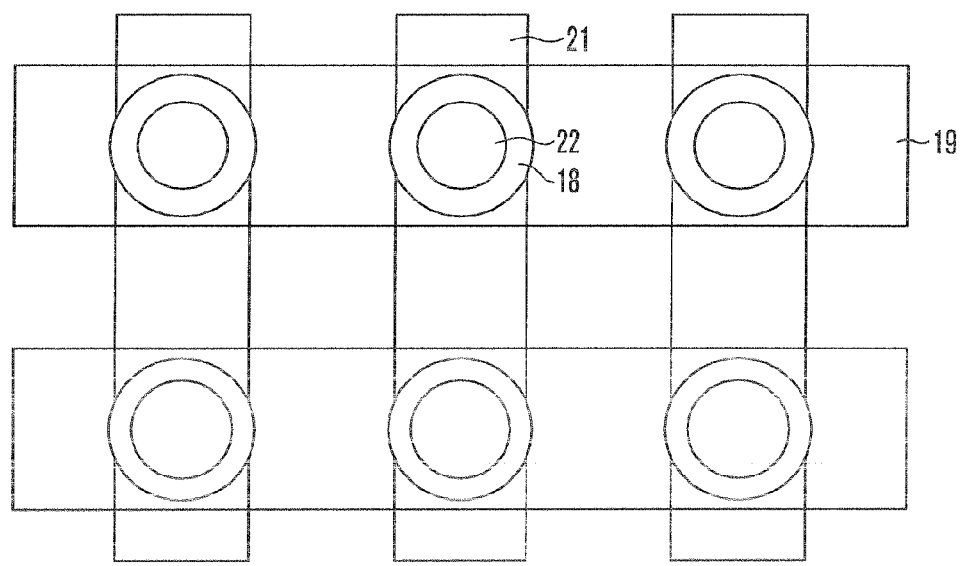
FIG. 1B illustrates a plane view of the typical semiconductor device with the vertical channel transistor.

In the figures, the dimensions of layers and regions are exaggerated for clarity of illustration. It will also be understood that when a layer is referred to as being "on/under" another layer or substrate, it can be directly on/under the other layer or substrate, or intervening layers may also be present. Like reference numerals refer to like elements throughout the drawings. In addition, changes to the English characters of the reference numerals of layers refer to a partial deformation of the layers by an etch process or a polishing process.

Figure 2A:
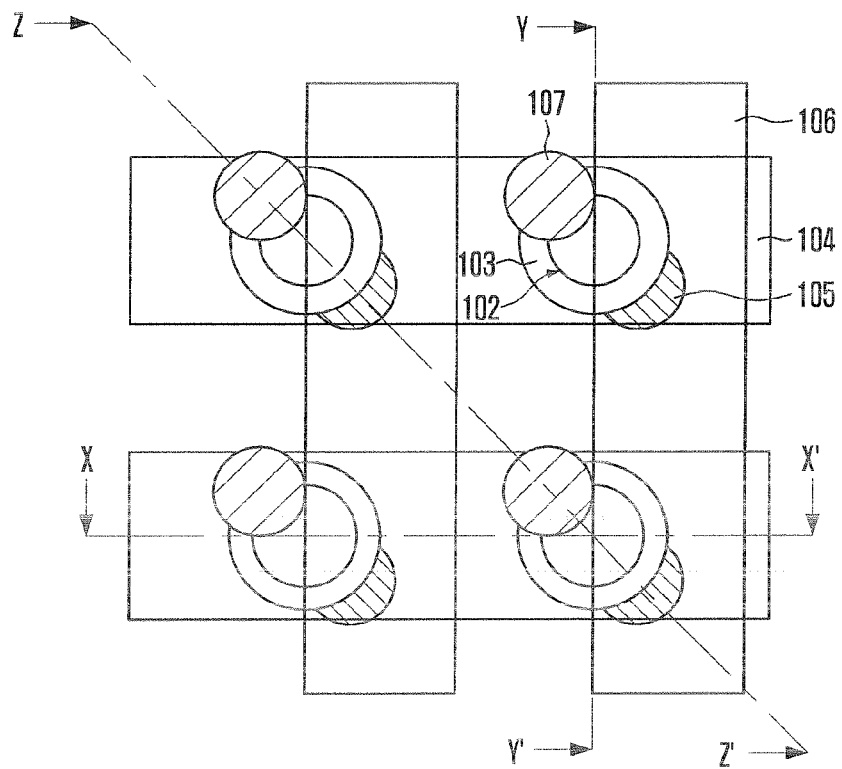
FIG. 2A illustrates a plane view of one embodiment of a semiconductor device with a vertical channel transistor.
Figure 2B:
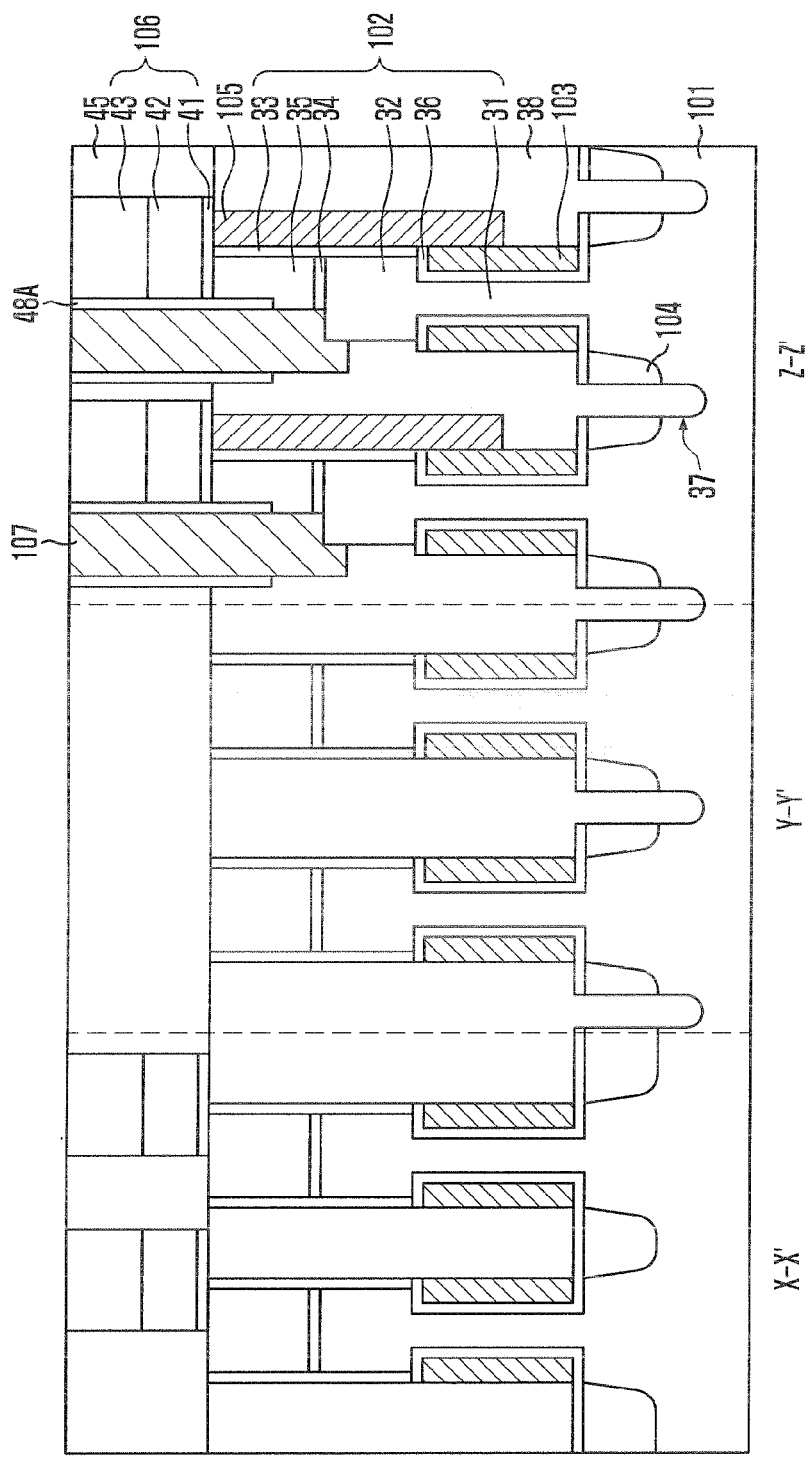
FIG. 2B illustrates a cross-sectional view taken along lines X-X', Y-Y', and Z-Z' of the semiconductor device shown in FIG. 2A.

In FIGS. 2A and 2B, the semiconductor device includes a plurality of pillar structures 102 disposed on a substrate 101, a gate electrode 103 surrounding a lower outer wall of the pillar structure 102, a first interlayer dielectric (ILD) layer 38 insulating the neighboring pillar structures 102 from each other, a gate contact 105 penetrating the first ILD layer 38 to be connected to a sidewall of the gate electrode 103, and a word line 106 connected to the gate contact 105.

Each of the pillar structure 102 includes an active pillar provided with a channel region 31 and a source region 32, and a gate dielectric 36 is formed on a surface of the channel region 31. The gate electrode 103 is formed on the gate dielectric 103 and is shaped to surround the channel region 31. The pillar structure 102 further includes a buffer layer 34 and a hard mask layer 35, which are stacked on the source region 32. In addition, the pillar structure 102 further includes a first capping layer 33 disposed on sidewalls of the hard mask layer 35, the buffer layer 34 and the source region 32. Bit lines 104 buried in the substrate 101 are separated from each other by a trench 37 filled with the first ILD layer 38.

The word line 106 has a line shape allowing a predetermined area thereof to overlap the pillar structure 102. Buffer layer 34 and hard mask layer 35 are provided over the active pillar and insulate the word line 106 from the active pillar. The semiconductor device further includes a storage node contact 107 that penetrates the hard mask layer 35 and the buffer layer 34, and connects to the source region 32 of the active pillar. A spacer 48A is formed on sidewalls of a storage node contact hole (reference numeral is omitted) filled with the storage node contact 107. The gate contact 105 and the storage node contact 107 face each other, with the pillar structure 102 interposed therebetween.

The word line 106 includes a stack structure provided with a barrier layer 41, a metal layer 42, and a hard mask insulation layer 43. The neighboring word lines 106 are insulated from each other through a second ILD layer 45. Barrier layer 41 is formed from at least one diffusion barrier material, selected, for example, from the group consisting of tungsten nitride (WN), tungsten silicon nitride (WSiN), tantalum nitride (TaN), titanium (Ti), and tungsten silicide (WSi), using a deposition method such an atomic layer deposition (ALD), physical vapor deposition (PVD), and chemical vapor deposition (CVD). In some embodiments, metal layer 42 is formed of at least one of tungsten (W), molybdenum (Mo), ruthenium (Ru), cobalt (Co), titanium (Ti), and tantalum (Ta) using a deposition method such as ALD, PVD, and CVD. In other embodiments, a metal silicide layer such as a tungsten silicide layer, a titanium silicide layer, and a tantalum silicide layer may be used instead of the metal layer 42. In still other embodiments, a metal nitride, e.g., WN, TiN, or TaN, may be used. The hard mask insulation layer 43 includes a nitride layer.

The word line 106 includes a material, which corresponds to the metal layer 42, and has a sheet resistance lower than that of gate electrode 103 and gate contact 105. The gate electrode 103 and the gate contact 105 include a polysilicon layer, and the word line 106 includes a metal-containing layer. The metal-containing layer includes at least one of WN, TiN, TaN, W, Ru, Co, Mo, Ti, Ta, and a metal silicide.

In addition, the word line 106 and the gate contact 105 include a material having a sheet resistance lower than that of the gate electrode 103. The gate electrode 103 includes a polysilicon layer, and the word line 106 and the gate contact 105 includes a metal-containing layer. The metal-containing layer includes at least one of WN, TiN, TaN, W, Ru, Co, Mo, Ti, Ta, and a metal silicide.

In some embodiments, as illustrated in FIGS. 2A and 2B, it is unnecessary to form the word line 106 in a damascene shape because the gate contact 105 is further provided. Accordingly, the sheet resistance of the word line 106 can be significantly reduced in comparison with that of a typical word line having a metal-to-polysilicon connection. That is, in some embodiments, the word line has a single structure of a metal-containing layer, which makes it possible to reduce the sheet resistance.

Furthermore, since the word line 106 is formed over the pillar structure 102, the word line can be easily patterned regardless of a space between the pillar structures 102. This can improve a photo margin because in some embodiments, it is unnecessary to consider the space between the pillar structures 102.

Figure 3A:
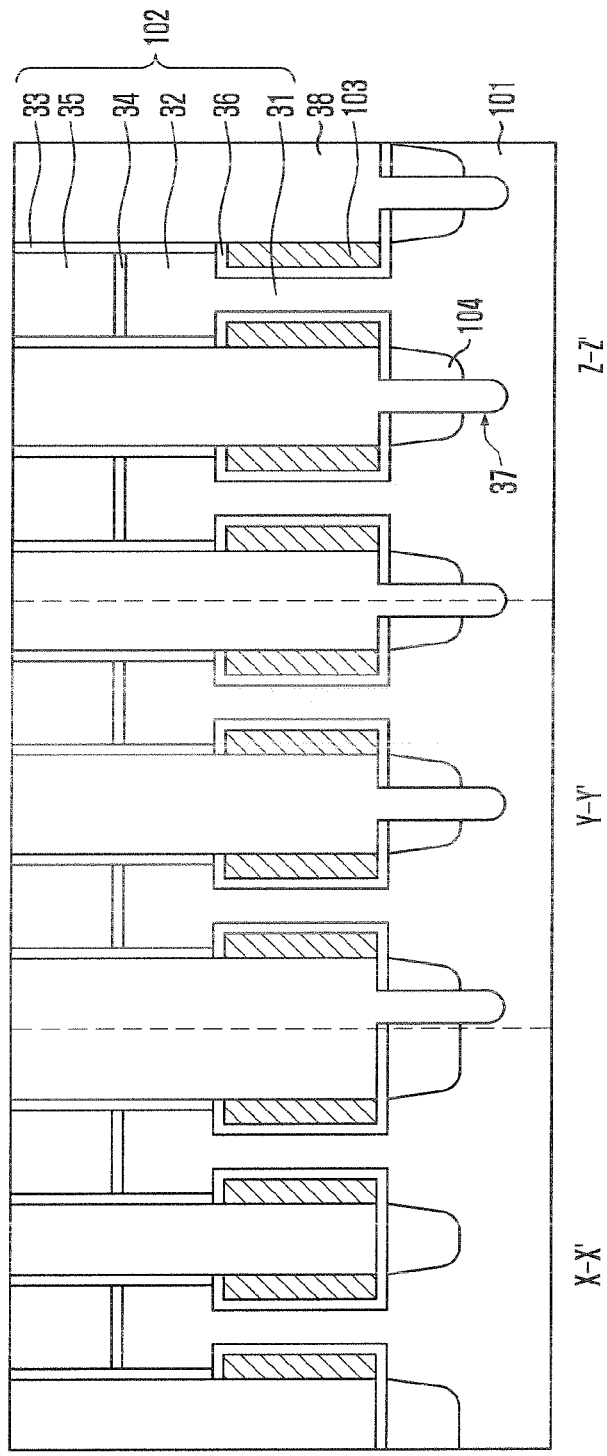

In FIG. 3A, a pillar structure 102, a gate electrode 103, and a bit line 104 are formed on a substrate 101 using known methods, whereby the gate electrode 103 surrounds a lower outer wall of the pillar structure 102, and the bit line 104 is buried in the substrate 101.

The pillar structure 102 includes a channel region 31, a source region 32, a first capping layer 33, a buffer layer 34, and a hard mask layer 35.

In some embodiments, anisotropic etching is first performed on the substrate 101 using the buffer layer 34 and the hard mask layer 35, thereby forming the source region 32. The source region 32 is also called 'head pillar'. The buffer layer 34 is made of silicon oxide ($SiO_2$), which in some embodiments is formed in a thickness range of approximately 50 Å to approximately 150 Å through thermal oxidation. The hard mask layer 35 may be formed of a material having an etch selectivity with respect to the buffer layer 34 and the substrate 101. For example, the hard mask layer 35 may be formed of silicon nitride ($Si_3N_4$) or silicon carbide (SiC), and may have a thickness of approximately 2,000 Å.

The first capping layer 33 is formed on sidewalls of the source region 32, the buffer layer 34, and the hard mask layer 35. In some embodiments, the first capping layer 33 has a monolayered structure of a nitride layer, or a multilayered structure of an oxide layer and a nitride layer that are sequentially formed. In addition, in some embodiments the oxide layer includes a silicon oxide ($SiO_2$) layer, and the nitride layer includes a silicon nitride ($Si_3N_4$) layer. The first capping layer 33 may be formed by performing deposition process on a resultant structure including the source region 32, and then performing etch-back process.

Furthermore, in some embodiments, the substrate 101 is anisotropically etched, and thereafter a pillar-trimming process is performed through an isotropic etching to form a channel region 31, also called a "body pillar."

The channel region 31 and the source region 32 form a T-shaped pillar structure that serves as an active pillar. In some embodiments, the channel region 31 is surrounded by a gate electrode and the source region 32 is connected to a storage node contact, both the gate electrode and the storage node contact to be formed later. Furthermore, in some embodiments, the channel region 31 has a round profile due to the isotropic etching.

A gate dielectric 36 is formed on a surface of the channel region 31 of the pillar structure. In some embodiments, the gate dielectric 36 includes a silicon oxide layer formed through deposition or oxidation.

The gate electrode 103 is formed by depositing a first conductive layer over the substrate 101 and the pillar structure 102, and performing an etch-back process until the gate dielectric 36 over the substrate 101, between the pillar structures 102, is exposed. In some embodiments, the first conductive layer used for the gate electrode 102 may be an n-type polysilicon layer, a p-type polysilicon layer, and a metal-containing layer. The metal-containing layer includes at least one of WN, TiN, TaN, W, Ru, Co, Mo, Ti, Ta, and a metal silicide. In some embodiments, in order for the surround type gate electrode 103 to surround the sidewall of the channel region 31, the gate electrode 103 is formed of a polysilicon, known to have good step coverage.

In some embodiments, impurity ions, e.g., phosphor (P) and arsenic (As), are implanted into the substrate 101 between the pillar structures 102 to form an impurity region serving as a drain region of a vertical channel transistor. The trench 37 isolates the impurity regions from each other so that a buried bit line 104 is formed in the substrate 101. A first ILD layer 38 fills the trench 37 and a space between the pillar structures 102, and in some embodiments, the depth of the trench 37 is greater than an ion implantation depth.

The first ILD layer 38 is formed to fill the space between the pillar structures 102, and the first ILD layer 38 and the substrate 101 are then etched to form the trench 37 penetrating the impurity region. The trench 37 is then filled with the first ILD layer 38. In this way, the first ILD layer is applied twice. In some embodiments, a surface of the first ILD layer 38 is planarized through chemical mechanical polishing (CMP), and the bit line 104 crosses the gate electrode 103 perpendicularly.

Figure 4A:
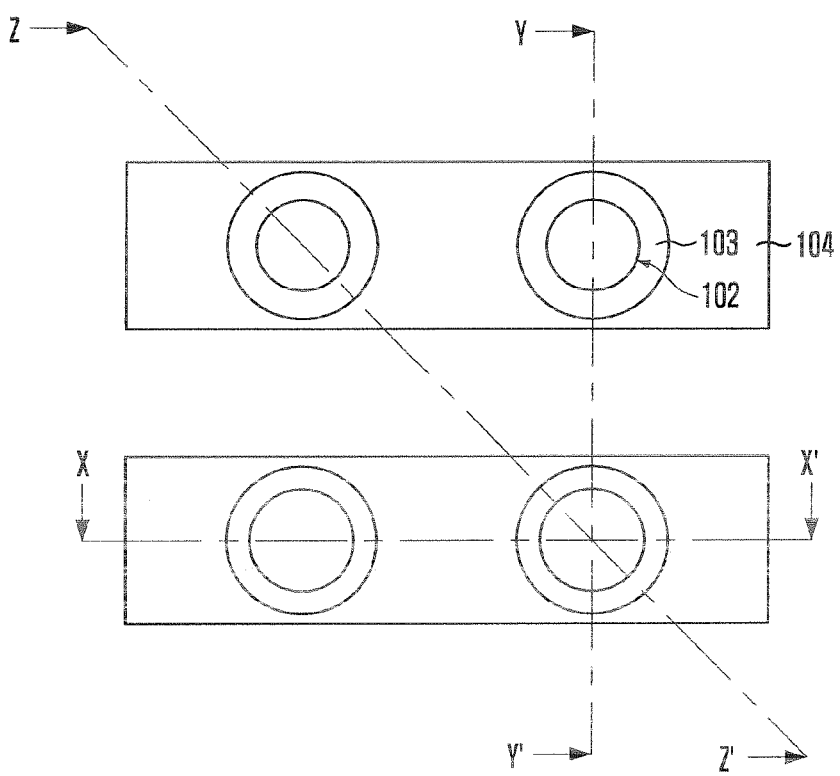
FIG. 4A illustrates a plane view of a resultant structure where a bit line is formed.

FIG. 4A depicts a plane view of a resultant structure wherein bit line 104 is formed. A plurality of the pillar structures 102 are arranged in a matrix form, and the gate electrode 103 surrounds a sidewall of the pillar structure, which in some embodiments, is a sidewall of the channel region 31. The bit line 104 is buried in the substrate.

Figure 3B:
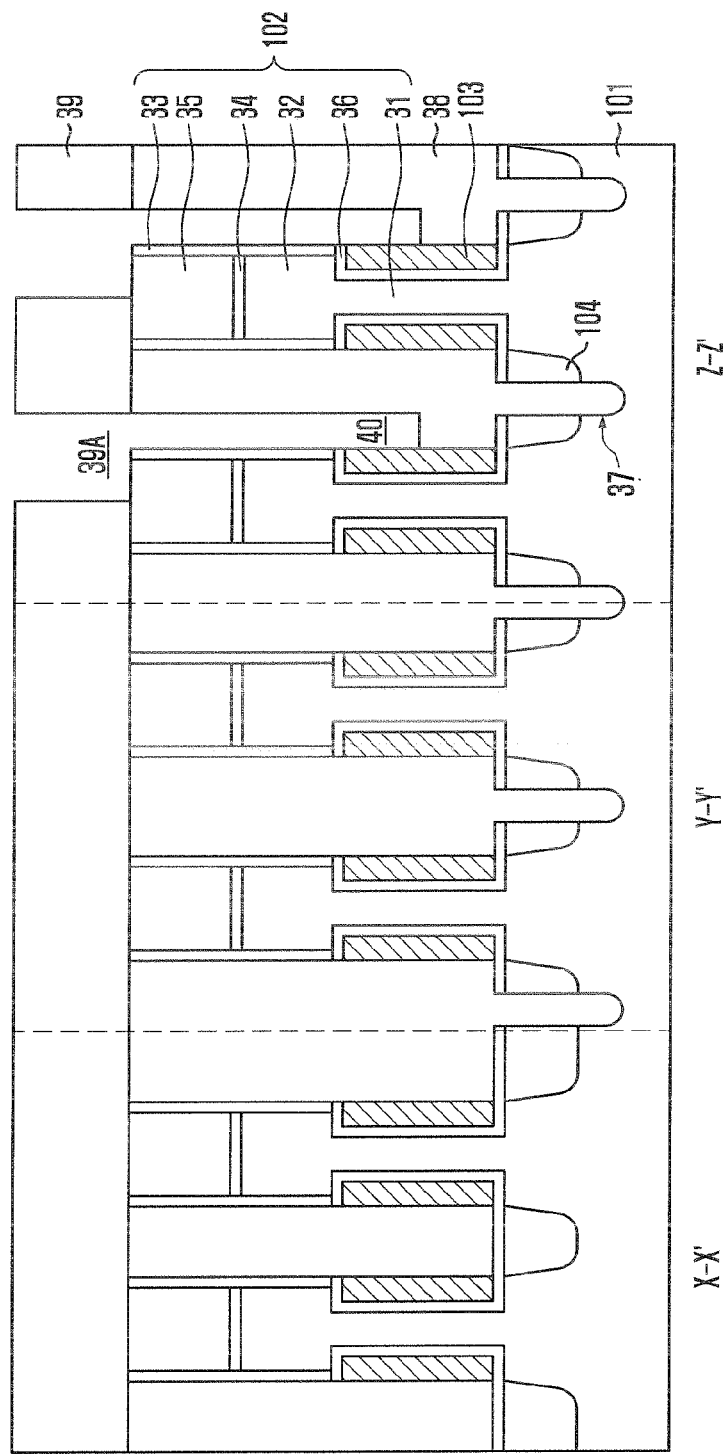

FIG. 3B depicts a photoresist layer formed on a resultant structure, which is then patterned through exposure and development to form a first contact mask 39. The first contact mask 39 has a hole-type opening 39A exposing the top of the pillar structure partially. The opening 39A of the first contact mask 39 is misaligned with the pillar structure 102 so as to expose one side of the adjacent pillar structure 102. In some embodiments, the opening 39A exposes a portion of the pillar structure 102 arranged in a diagonal direction, i.e., Z-Z' direction. Therefore, the pillar structure 102 and the opening 39A partially overlap each other. The first contact mask 39 covers the pillar structure 102 in X-X' and Y-Y' directions, however the opening 39A of the first contact mask 39 shifts in Z-Z' direction to expose a portion of the pillar structure 102. That is, the opening 39A of the first contact mask 39 exposes the portion of the pillar structure 102 in only Z-Z' direction.

The first ILD layer 38 is partially etched using the first contact mask 39 as an etch barrier to form contact hole 40. The shape of the contact hole 40 is transcribed from the shape of the opening 39A of the first contact mask 39. The opening 39A partially overlaps the pillar structure 102, and thus the contact hole 40 is aligned with one sidewall of the pillar structure 102. In some embodiments, the depth of the contact hole 40 is sufficient if the surface of the gate electrode 102 can be exposed. Furthermore, in some embodiments, the diameter of the contact hole 40 is smaller than that of the pillar structure 102.

Figure 3C:
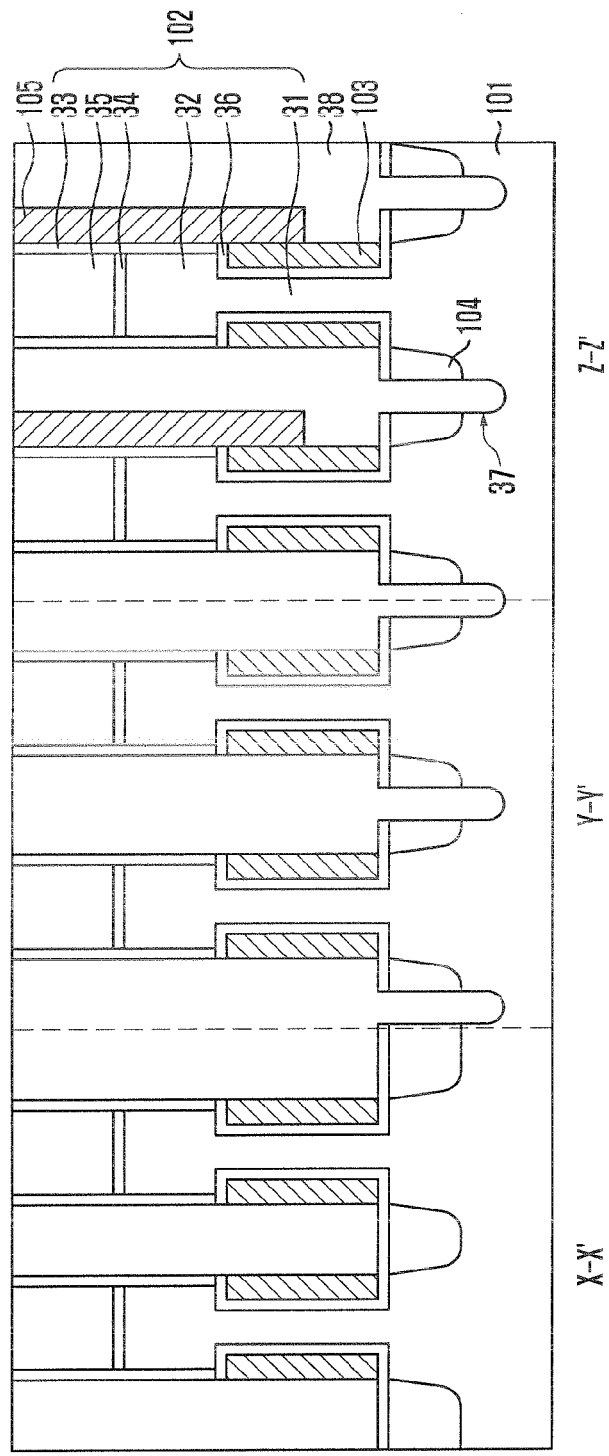

Referring to FIG. 3C, the first contact mask 39 is removed, and a second conductive layer is deposited on a resultant structure until it fills the contact hole 40. Thereafter, the second conductive layer is planarized through etch-back or CMP process, thus forming a gate contact 105 in the contact hole 40. The gate contact 105 electrically connects the gate electrode 103 to a word line to be formed later.

In some embodiments, the gate contact 105 is formed of the same material as that of the gate electrode 103. In other embodiments, gate contact 105 is formed of a material having a sheet resistance lower than that of the gate electrode 103. For example, in some embodiments, gate contact 105 is formed of a polysilicon, and in other embodiments, is formed of a material having a sheet resistance lower than that of a polysilicon.

The material having a sheet resistance lower than a polysilicon may include a metal-containing layer. The metal-containing layer includes at least one of W, Mo, Ru, Co, WN, TiN, Ti, Ta, and a metal silicide. The metal silicide includes at least one of tungsten silicide ($WSi_x$), titanium silicide ($TiSi_x$), and tantalum silicide ($TaSi_x$). Thus, in some embodiments, it is possible to reduce the resistance from the word line to the gate electrode when the gate contact 105 is formed of a low-sheet resistance material. In addition, in some embodiments, a barrier layer may be omitted in case of using the low-sheet resistance material.

FIG. 4B illustrates a plane view of a resultant structure where the gate contact 105 is formed. The gate contact 105 is in contact with one sidewall of the gate electrode 103.

Figure 3D:
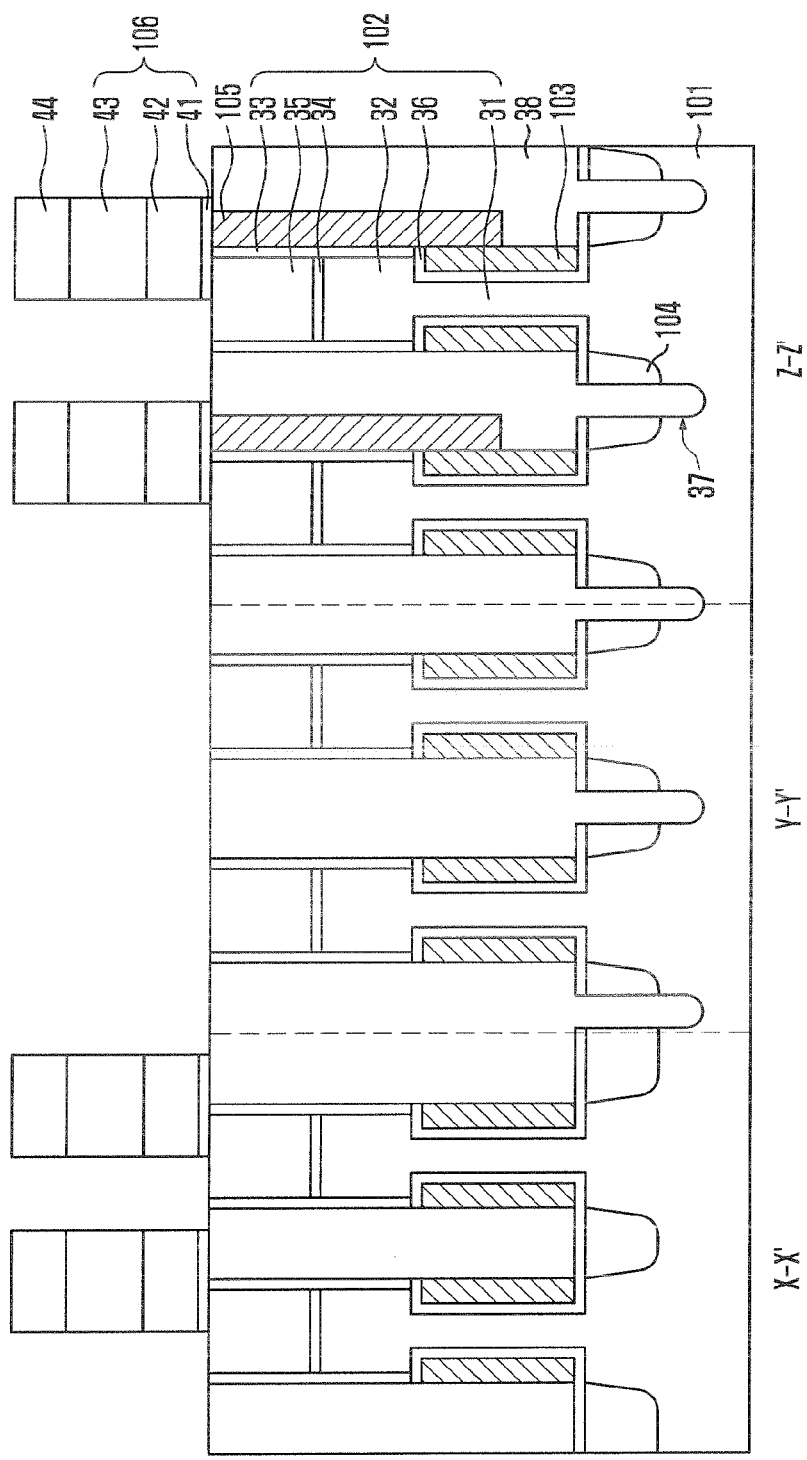

FIG. 3D depicts a third conductive layer that forms word line 106 over the resultant structure of FIG. 4B, including gate contact 105.

In some embodiments, word line 106 includes a metal such as W, Mo, Ru, Co, Ti and Ta, a metal silicide such as tungsten silicide, titanium silicide and tantalum silicide, and/or a metal nitride such as WN, TiN and TaN. Accordingly, word line 106 has a low sheet resistance. Furthermore, because in some embodiments, gate electrode 103 includes a polysilicon layer and word line 106 includes a metal-containing layer, word line 106 has a lower sheet resistance than gate electrode 103.

In some embodiments, the word line 106 may be formed by sequentially forming a third conductive layer and a hard mask insulation layer 43, and then etching them using a line-shaped word line mask 44. In some embodiments a width and an overlay are adjusted during a masking process of the word line mask 44 so that the word line 106 contacts the gate contact 105 thereunder, and exposes a ⅓ portion of pillar structure 102. The third conductive layer includes a barrier layer 41 and a metal layer 42. The barrier layer 41 is formed from at least one diffusion barrier material that in some embodiments is selected from the group consisting of WN, WSiN, TaN, Ti, and WSi using a deposition method such as ALD, PVD, and CVD. The metal layer 42 may, in some embodiments be formed of at least one of W, Mo, Ru, Co, Ti, and Ta using a deposition method such as ALD, PVD, and CVD. In other embodiments, a metal silicide layer such as a tungsten silicide layer, a titanium silicide layer, and a tantalum silicide layer is used for a layer formed between the barrier layer 41 and the hard mask insulation layer 43. In still other embodiments, a metal nitride, e.g., WN, TiN, or TaN, may be used. The hard mask insulation layer 43 includes a nitride layer.

Figure 4C:
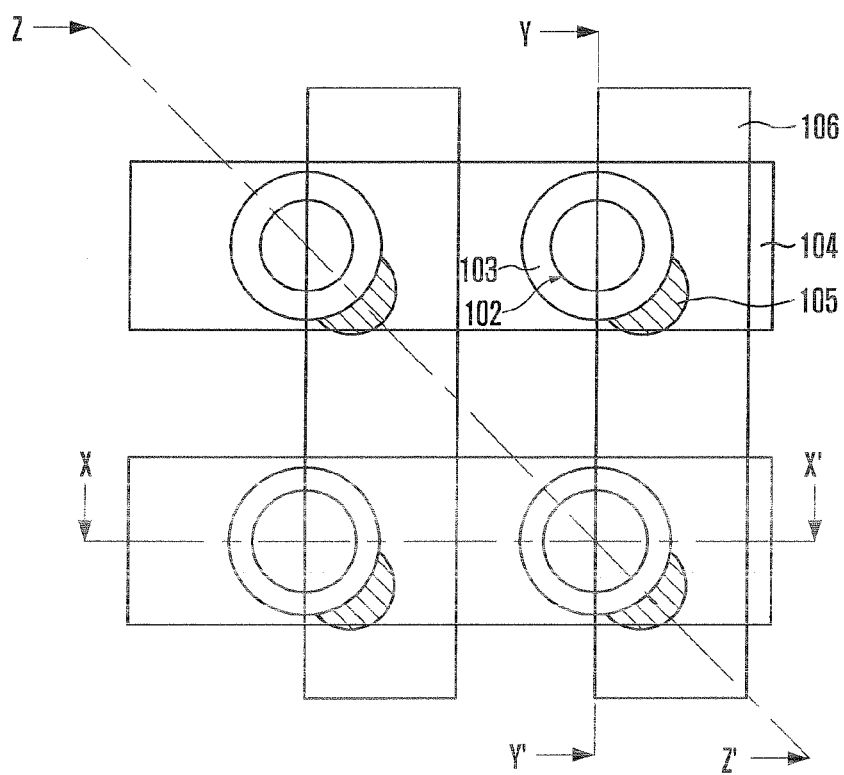
FIG. 4C illustrates a plane view of a resultant structure where a word line is formed.

FIG. 4C illustrates a plane view of a resultant structure having the formed word line 106.

Figure 3E:
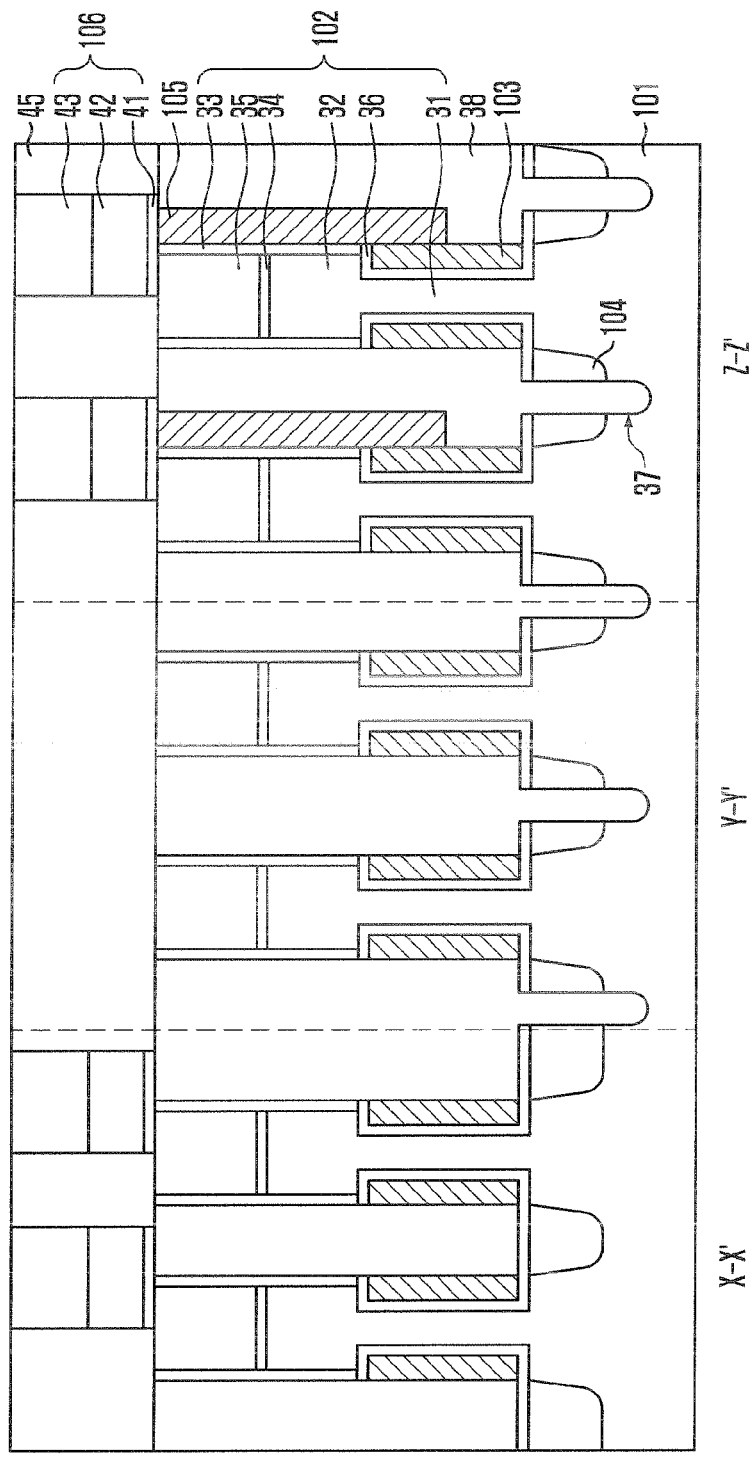

FIG. 3E depicts wherein word line mask 44 is removed, and a second ILD layer 45 is then deposited on the resultant structure. The second ILD layer 45 is planarized until the top surface of the word line 106 is exposed. In some embodiments, planarization is then performed through etch-back or CMP processing, whereby the second ILD layer 45 remains between word lines 106.

In at least one embodiment, a method of forming a storage node contact includes a primary contact etching process, a spacer-forming process, and a secondary contact etching process, performed in sequence.

Figure 3F:
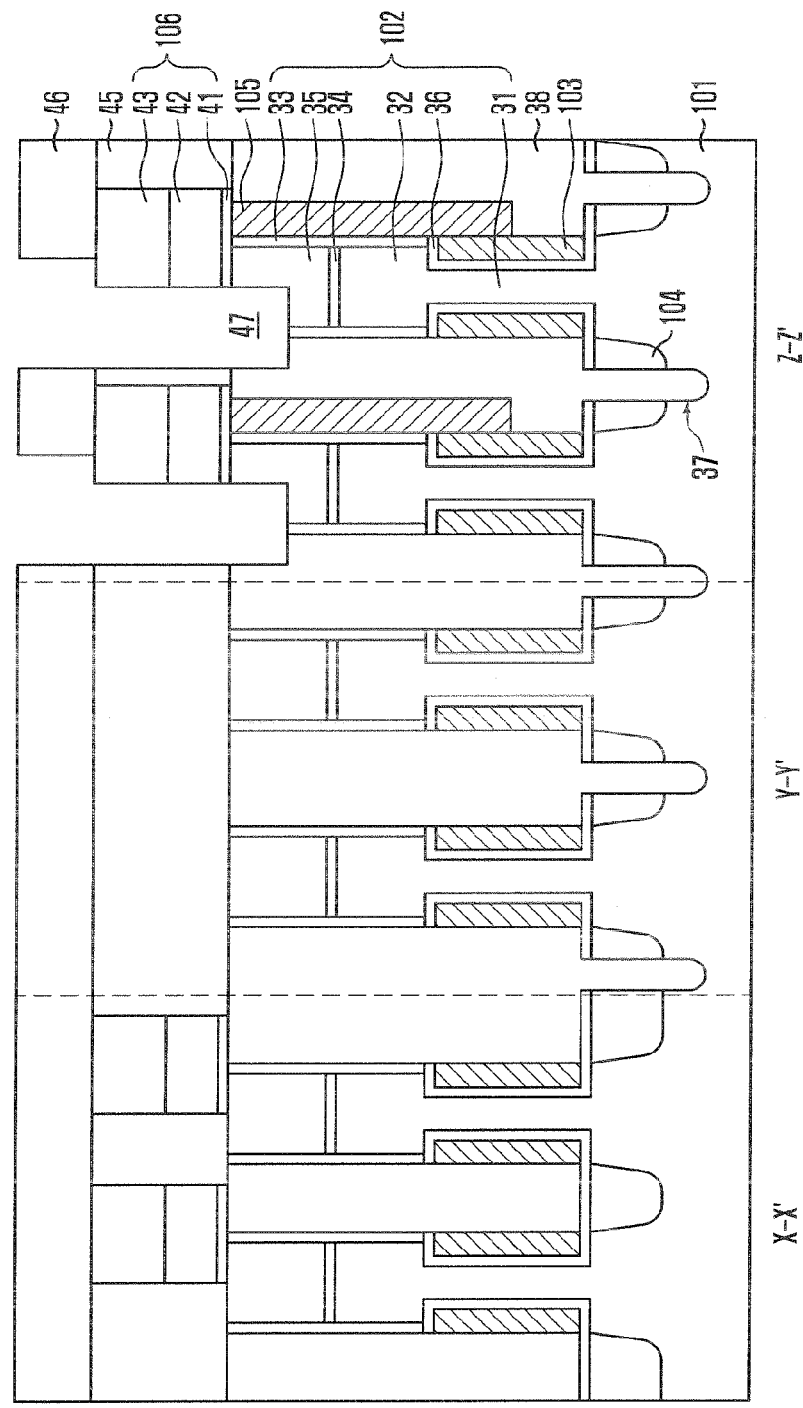

FIG. 3F depicts a photoresist layer formed over a resultant structure, and then patterned through exposure and development to form a second contact mask 46. The second contact mask 46 partially overlaps the pillar structure in a plane view.

The primary contact etching is performed using the second contact mask 46 as an etch barrier. During the primary contact etching, the second ILD layer 45 is etched, and the hard mask layer 35 and the first capping layer 33 disposed under the second ILD layer 45 are partially etched.

Based upon the above process, a primary contact hole 47 is formed. The second contact mask 46 is used as a storage node contact mask, and the primary contact hole 47 is an initial shape of a storage node contact hole. In a plane view, the primary contact hole 47 is formed opposite to the gate contact 105 in direction Z-Z', with the pillar structure 102 interposed therebetween.

Referring to FIG. 3G, the second contact mask 46 is removed, and a second capping layer 48 is then formed over a resultant structure so as to prevent the storage node contact and the word line from being electrically shorted. The second capping layer 48 includes a nitride layer.

Figure 3H:
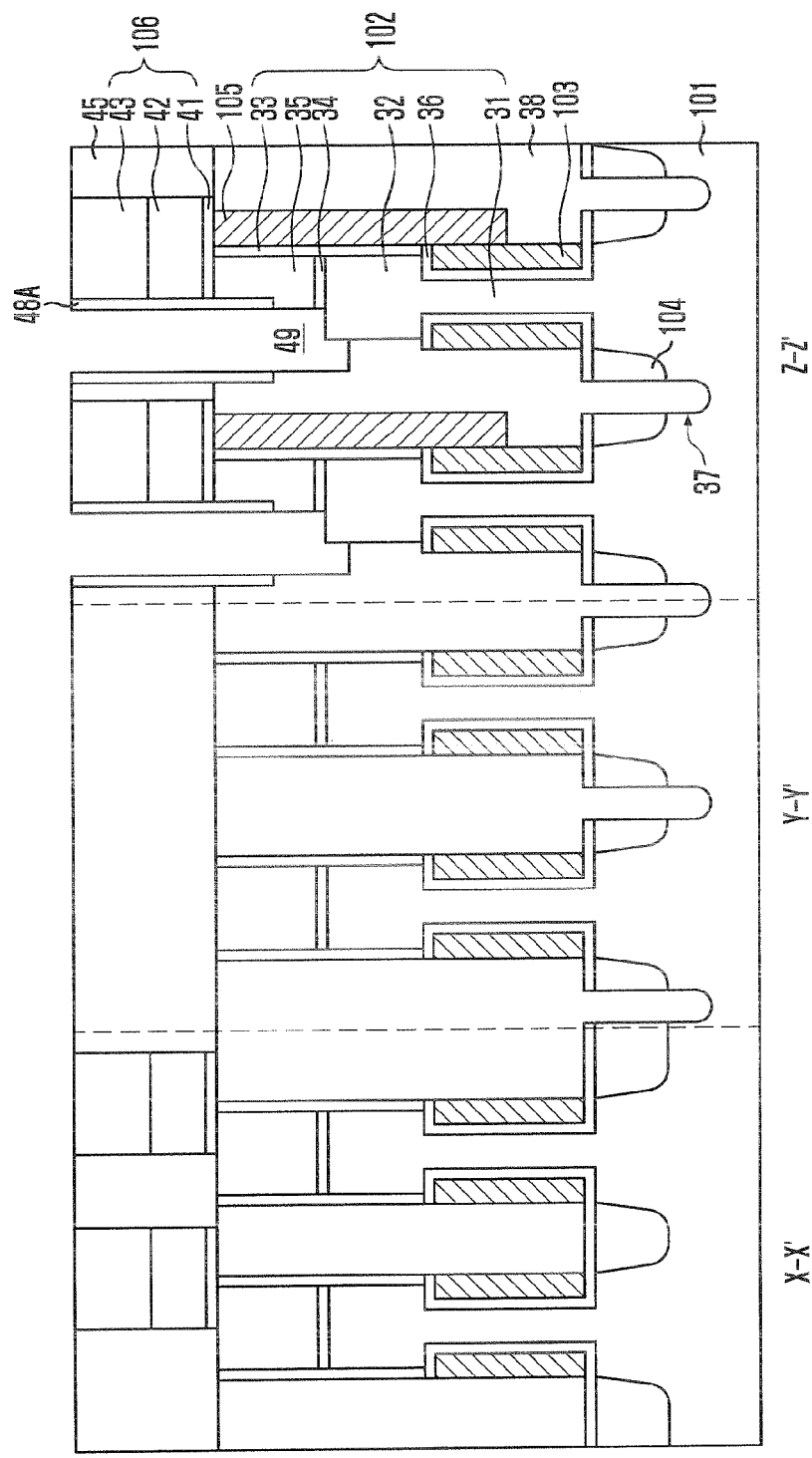

FIG. 3H depicts wherein the second capping layer 48 is etched through blanket etch to form a spacer 48A on a sidewall of the primary contact hole 47, and then the secondary contact etching is performed. During the secondary contact etching, the hard mask layer 35 and the buffer layer 34, which are exposed after the formation of the spacer 48A, are etched until the source region 32 is partially exposed. The secondary contact etching is performed in a self-aligned manner due to the spacer 48A.

After the secondary contact etching, a secondary contact hole 49 is formed, and the source region 32 is exposed by the secondary contact hole 49. A final storage node contact hole is formed by the secondary contact hole 49.

Figure 3I:
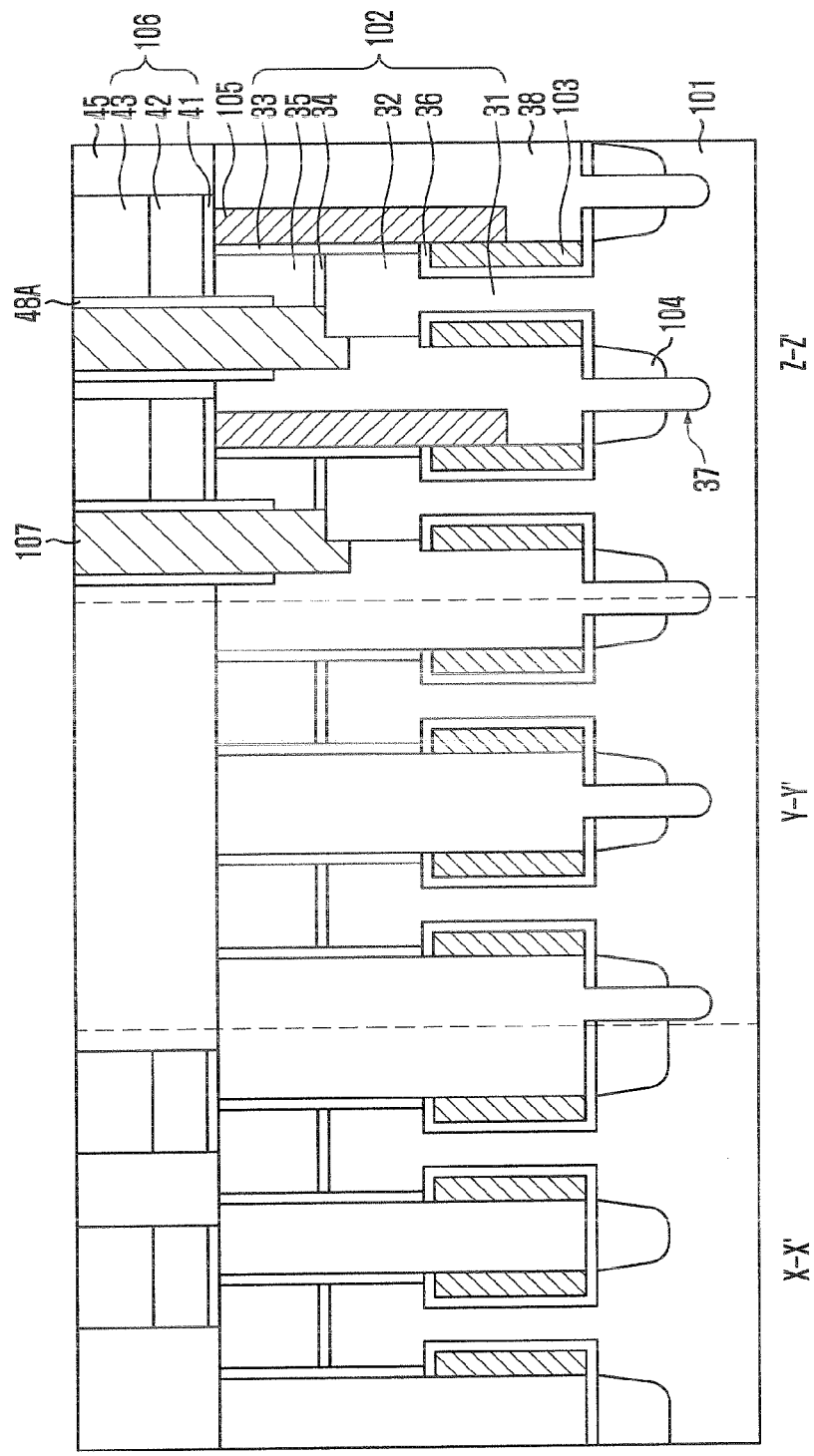

FIG. 3I depicts wherein a polysilicon layer is deposited on a resultant structure so as to fill the secondary contact hole 49, and the polysilicon layer is then planarized to form a storage node contact 107.

Figure 4D:
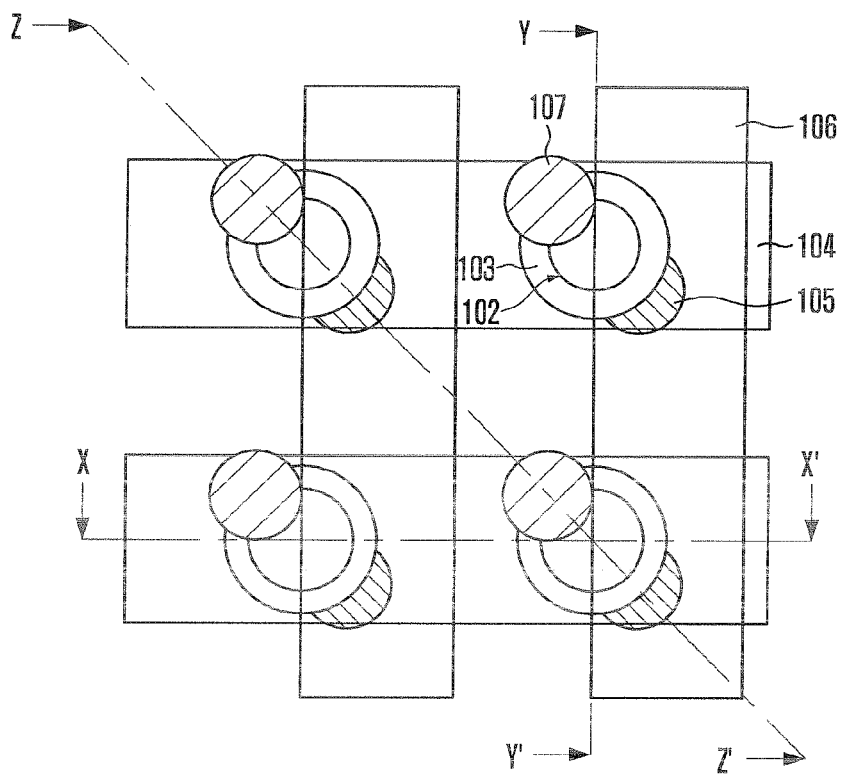
FIG. 4D illustrates a plane view of a resultant structure where a storage node contact is formed.

FIG. 4D illustrates, in plane view, wherein storage node contact 107 and gate contact 105 are arranged opposite to each other with respect to the pillar structure 102, and are arranged so as to maximize, in a diagonal direction, a space between the pillar structures 102. In other words, gate contact 105 faces storage node contact 107, with pillar structure 102 interposed therebetween. Although not shown, a spacer or an ILD layer exists between the word line 106 and the storage node contact 107.

In accordance with at least one embodiment, it is unnecessary to form the word line 106 in a damascene shape because gate contact 105 is provided. Accordingly, in some embodiments, the sheet resistance of the word line 106 can be significantly reduced in comparison with that of a typical word line having a metal-to-polysilicon connection. That is, the word line has a single structure of a metal-containing layer, making it possible to reduce the sheet resistance.

Furthermore, because word line 106 is formed over the pillar structure 102, in some embodiments, word line 106 can be easily patterned regardless of a space between the pillar structures 102. In other words, because in some embodiments it is unnecessary to consider the space between pillar structures 102, a photo margin may be improved.

Figure 5:
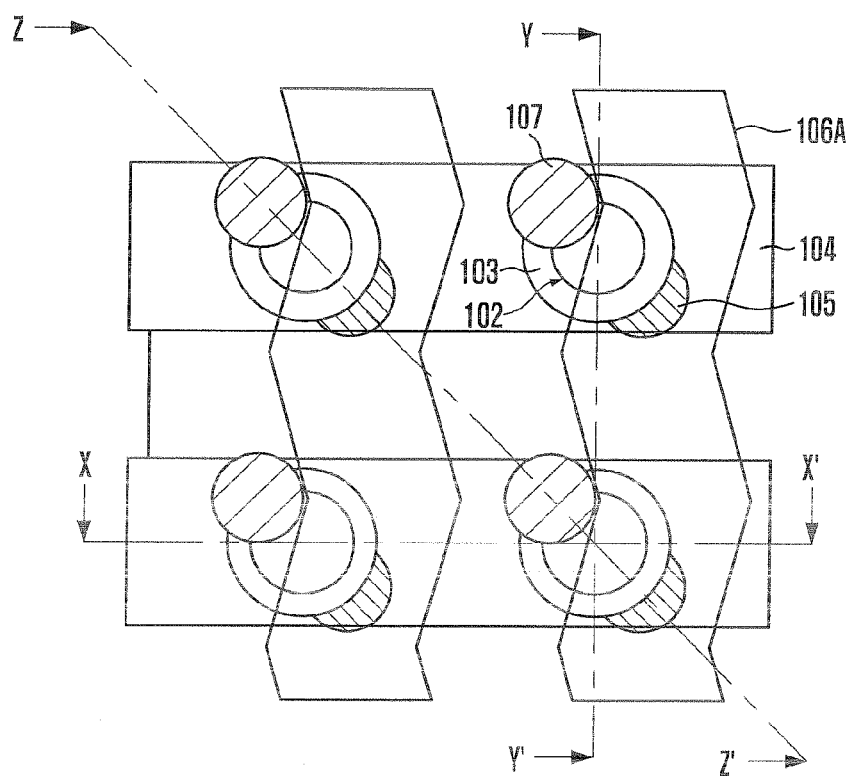
FIG. 5 illustrates a plane view of a semiconductor device in accordance with another embodiment of a semiconductor device with a vertical channel transistor.

FIG. 5 is similar to FIG. 3D and, except for word line 106A, illustrates a plane view of a semiconductor device in accordance with another embodiment.

In the embodiment of FIG. 5, word line 106A has a zigzag shape in order to further reduce the sheet resistance by increasing a linewidth of the word line.

In accordance with the foregoing embodiments, the word line has a monolayered structure of metal layers, which can reduce the sheet resistance of the word line. That is, the sheet resistance of word lines having a metal-to-metal connection is significantly lower than that of word lines having a metal-to-polysilicon connection.

Typically, the polysilicon layer is doped with impurities to reduce the sheet resistance, however, the polysilicon layer doped with impurities is very higher in sheet resistance than metal-containing layers.

The embodiments disclosed herein can increase a driving current because the sheet resistance of the word line can be reduced. Furthermore, the reduction in the sheet resistance of the world line can in some embodiments increase an area of a memory array, thereby increasing cell efficiency remarkably.

In addition to DRAMs, the embodiments disclosed herein are applicable to nonvolatile memories with a vertical channel transistor, for example, a flash memory, a silicon-oxide-nitride-oxide-silicon (SONOS) nonvolatile memory, or a tantalum-aluminum oxide-nitride-oxide-silicon (TANOS) nonvolatile memory.

Furthermore, in some embodiments a word line and a gate electrode are connected through a gate contact so that the word line can be formed over a pillar structure. Accordingly, an area of a memory array can be increased, thus increasing cell efficiency.

Still further, because the word line has only a single structure of a metal-containing layer, in some embodiments it is possible to obtain a word line of which a sheet resistance is smaller than that of a word line having a metal-to-polysilicon connection. Consequently, in some embodiments a semiconductor device with high-speed performance is achieved.

It will be apparent to those skilled in the art that various changes and modifications may be made without departing from the spirit and scope of the invention as defined in the following claims.

What is claimed is:

1. A semiconductor device, comprising:
   a substrate;
   a plurality of pillar structures, each pillar structure including an active pillar disposed over the substrate;
   a gate electrode surrounding an outer wall of the active pillar;
   an interlayer dielectric (ILD) layer insulating adjacent pillar structures;
   a gate contact penetrating the ILD layer and connected to a sidewall of the gate electrode;
   a word line connected to the gate contact, wherein the word line is formed to have a continuous line shape; and
   a storage node contact connected to an upper region of the active pillar,
   wherein
   the gate contact and the storage node contact face each other, with the pillar structure interposed therebetween; and
   in a plan view of the substrate, the gate contact and the storage node contact are arranged on opposite sides of the pillar structure.

2. The semiconductor device of claim 1, wherein the word line includes a material having a lower sheet resistance than the gate electrode and the gate contact.

3. The semiconductor device of claim 2, wherein the gate electrode and the gate contact include a polysilicon layer.

4. The semiconductor device of claim 2, wherein the word line includes a metal-containing layer.

5. The semiconductor device of claim 4, wherein the metal-containing layer includes at least one selected from the group consisting of tungsten nitride (WN), titanium nitride (TiN), tantalum nitride (TaN), tungsten (W), ruthenium (Ru), cobalt (Co), molybdenum (Mo), titanium (Ti), tantalum (Ta), and a metal silicide.

6. The semiconductor device of claim 1, wherein the word line and the gate contact include a material having a lower sheet resistance than the gate electrode.

7. The semiconductor device of claim 6, wherein the gate electrode includes a polysilicon layer.

8. The semiconductor device of claim 6, wherein the word line and the gate contact includes a metal-containing layer.

9. The semiconductor device of claim 1, wherein the word line and the pillar structure partially overlap each other.

10. The semiconductor device of claim 9, wherein the word line is a zigzag-shaped wave pattern.

11. The semiconductor device of claim 1,
    wherein the word line and the active pillar are insulated from each other through a buffer layer and a hard mask layer located over the active pillar, and
    wherein the storage node contact penetrates portions of the hard mask layer and the buffer layer.

12. The semiconductor device of claim 1, wherein, in a thickness direction of the substrate, the word line is arranged above the gate contact.

13. The semiconductor device of claim 1, wherein, in the plan view of the substrate, the word line has opposite longitudinal edges, and only one of the edges overlaps the active pillar.

14. The semiconductor device of claim 1, wherein, in the plan view of the substrate, the gate contact and the storage node contact are arranged on diametrically opposite sides of the pillar structure.

15. A semiconductor device, comprising:
    a substrate;
    a plurality of pillar structures, each pillar structure including an active pillar disposed over the substrate;
    a gate electrode surrounding an outer wall of the active pillar;
    an interlayer dielectric (ILD) layer insulating adjacent pillar structures;
    a gate contact penetrating the ILD layer and connected to a sidewall of the gate electrode;
    a word line connected to the gate contact, wherein the word line is formed to have a continuous line shape; and
    a storage node contact connected to an upper region of the active pillar,
    wherein
    the gate contact and the storage node contact face each other, with the pillar structure interposed therebetween; and
    in a thickness direction of the substrate, the word line is arranged above the gate contact.

16. A semiconductor device, comprising:
    a substrate;
    a plurality of pillar structures, each pillar structure including an active pillar disposed over the substrate;
    a gate electrode surrounding an outer wall of the active pillar;
    an interlayer dielectric (ILD) layer insulating adjacent pillar structures;
    a gate contact penetrating the ILD layer and connected to a sidewall of the gate electrode;
    a word line connected to the gate contact, wherein the word line is formed to have a continuous line shape; and
    a storage node contact connected to an upper region of the active pillar,
    wherein
    the gate contact and the storage node contact face each other, with the pillar structure interposed therebetween; and
    in a plan view of the substrate, the word line has opposite longitudinal edges, and only one of the edges overlaps the active pillar.

* * * * *